(12) United States Patent
Bhattacharyya

(10) Patent No.: US 7,385,245 B2
(45) Date of Patent: Jun. 10, 2008

(54) LOW POWER MEMORY SUBSYSTEM WITH PROGRESSIVE NON-VOLATILITY

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 207 days.

(21) Appl. No.: 11/370,125

(22) Filed: Mar. 7, 2006

(65) Prior Publication Data

US 2006/0192242 A1 Aug. 31, 2006

Related U.S. Application Data

(62) Division of application No. 11/066,905, filed on Feb. 25, 2005, now Pat. No. 7,276,760.

(51) Int. Cl.
*H01L 27/148* (2006.01)
*H01L 29/768* (2006.01)

(52) U.S. Cl. .............. 257/321; 257/314; 257/315; 257/320; 257/E29.309

(58) Field of Classification Search ........ 257/320–321, 257/314–315, 317, 332, E29.309; 365/185.03
See application file for complete search history.

(56) References Cited

U.S. PATENT DOCUMENTS

| | | | |
|---|---|---|---|
| 6,040,216 A | 3/2000 | Sung | |
| 6,093,606 A * | 7/2000 | Lin et al. | 438/259 |
| 6,266,278 B1 * | 7/2001 | Harari et al. | 365/185.18 |
| 6,657,250 B1 * | 12/2003 | Rudeck | 257/315 |
| 6,784,480 B2 | 8/2004 | Bhattacharyya | |
| 6,927,136 B2 * | 8/2005 | Lung et al. | 438/288 |
| 6,927,145 B1 * | 8/2005 | Yang et al. | 438/420 |
| 7,005,697 B2 * | 2/2006 | Batra et al. | 257/315 |
| 2002/0163834 A1 | 11/2002 | Scheuerlein et al. | |
| 2005/0199944 A1 | 9/2005 | Chen et al. | |

FOREIGN PATENT DOCUMENTS

| | | |
|---|---|---|
| JP | 6-5822 A | 1/1994 |
| JP | 8-8350 A | 1/1996 |

OTHER PUBLICATIONS

Dana Lee et al.; Vertical floating-gate $4.5F^2$ Split-gate NOR Flash Memory at 110nm Node; Silicon Storage Technology, Inc. and PowerChip Semiconductor Corporation; 2004 Symposium on VLSI Technology Digest of Technical Papers; pp. 72-73.

* cited by examiner

*Primary Examiner*—Shouxiang Hu
(74) *Attorney, Agent, or Firm*—Leffert Jay & Polgalze, P.A.

(57) ABSTRACT

The memory system is comprised of a plurality of memory arrays that are coupled to a processor. The memory arrays are comprised of non-volatile memory cells that have read/write speeds and charge retention times that are different from the other memory arrays of the system. Each of the memory cells of each array has a tunnel layer under an embedded trap layer. Each array has memory cells with a different tunnel layer thickness to change the read/write speeds and charge retention times for that array.

20 Claims, 5 Drawing Sheets

LOW POWER MEMORY SUBSYSTEM WITH PROGRESSIVE NON-VOLATILITY

RELATED APPLICATION

This application is a divisional of U.S. patent application Ser. No. 11/066,905, filed Feb. 25, 2005 now U.S. Pat. No. 7,276,760 and titled, "LOW POWER MEMORY SUBSYSTEM WITH PROGRESSIVE NON-VOLATILITY" which is commonly assigned and incorporated by reference in its entirety herein.

TECHNICAL FIELD OF THE INVENTION

The present invention relates generally to memory devices and in particular the present invention relates to non-volatile memory devices.

BACKGROUND OF THE INVENTION

Memory devices are typically provided as internal, semiconductor, integrated circuits in computers or other electronic devices. There are many different types of memory including read only memory (ROM), static random-access memory (SRAM), dynamic random access memory (DRAM), and flash memory.

Conventional DRAM cells are comprised of a switching transistor and an integrated storage capacitor tied to the storage node of the transistor. Charge storage is enhanced by providing appropriate storage capacity in the form of a stacked capacitor or a trench capacitor in parallel with the depletion capacitance of the floating storage node. DRAM cells are volatile and therefore lose data when the power is removed.

DRAMs use one or more arrays of memory cells arranged in rows and columns. Each of the rows of memory cells is activated by a corresponding row line that is selected from a row address. A pair of complementary digit lines are provided for each column of the array and a sense amplifier coupled to the digit lines for each column is enabled responsive to a respective column address. The sense amplifier senses a small voltage differential between the digit lines and amplifies such voltage differential.

Due to finite charge leakage across the depletion layer, the capacitor has to be recharged frequently to ensure data integrity. This is referred to in the art as refreshing and can be accomplished by periodically coupling the memory cells in the row to one of the digit lines after enabling the sense amplifiers. The sense amplifiers then restore the voltage level on the memory cell capacitor to a voltage level corresponding to the stored data bit. The permissible time between refresh cycles without losing data depends on various factors such as rate of charge dissipation in the memory capacitor.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

For code applications, a faster performing, less dense NOR cell is typically employed. For data storage applications, a slower performing, denser NAND cell configuration is typically employed.

SRAM, DRAM, and flash memories typically require relatively large amounts of power. This is due to the volatile memories high current requirement during programming and addressing and/or the requirement for frequent refreshing. Flash memory typically operates by channel hot electron injection that is very power inefficient. Therefore, memory systems that are built on the hierarchy of SRAM/DRAM/flash have a high power requirement and are thus not optimal for portable electronic devices. An additional problem is that flash memory has a limited endurance due to the high programming voltages.

Silicon-oxide-nitride-oxide-silicon (SONOS) type memories have lower power requirements but require higher fields (typically 8-10 W/cm) and are slow to write and erase. Direct Tunnel Memories (DTM) based on ultra-thin tunnel oxide exhibit infinite endurance but memory retention is on the order of 1-10 seconds.

For the reasons stated above, and for other reasons stated below which will become apparent to those skilled in the art upon reading and understanding the present specification, there is a need in the art for a higher performance and higher endurance non-volatile memory device that can bridge the application gap between DRAM and non-volatile memory devices.

SUMMARY

The above-mentioned problems with non-volatile memory, performance, and other problems are addressed by the present invention and will be understood by reading and studying the following specification.

The embodiments of the present invention encompass a memory system that includes embedded trap direct tunnel memory (DTM) non-volatile cells with progressive non-volatility. The memory system comprises a control circuit for generating memory system signals that is coupled to a plurality of memory arrays. Each memory array is comprised of a plurality of memory cells with a gate stack having a tunnel layer. At least two of the plurality of memory arrays comprises memory cells that have tunnel layers with different thicknesses.

The memory cells, in one embodiment, are enhanced, non-volatile DTM cells that are formed on a substrate with doped drain and source regions. An oxynitride layer is formed over the substrate between each drain/source region pair. An embedded trap layer is formed over the oxynitride layer. An injector layer is formed over the embedded trap layer. A high dielectric constant layer is formed over the injector layer. A polysilicon control gate formed over the high dielectric constant layer.

The cells can be formed in a planar architecture or a two element, split channel, three-dimensional device. The planar cell is formed with the high dielectric constant layer being formed over and substantially around three sides of the embedded trap layer. The polysilicon control gate is also formed substantially around three sides of the high dielectric constant layer.

The split channel, three-dimensional device is formed in a trench where the bi-stable elements are formed on each sidewall in series with a fixed threshold element. A shared control gate is formed in the trench such that it is shared by all of the elements in the trench. The control gate and an oxide layer that separates the control gate from the sidewalls forms the fixed threshold devices. A source line region is formed in the substrate at the bottom of the trench and bit line regions are formed on either side of the trench.

Further embodiments of the invention include methods and apparatus of varying scope.

DETAILED DESCRIPTION

Figure 1:
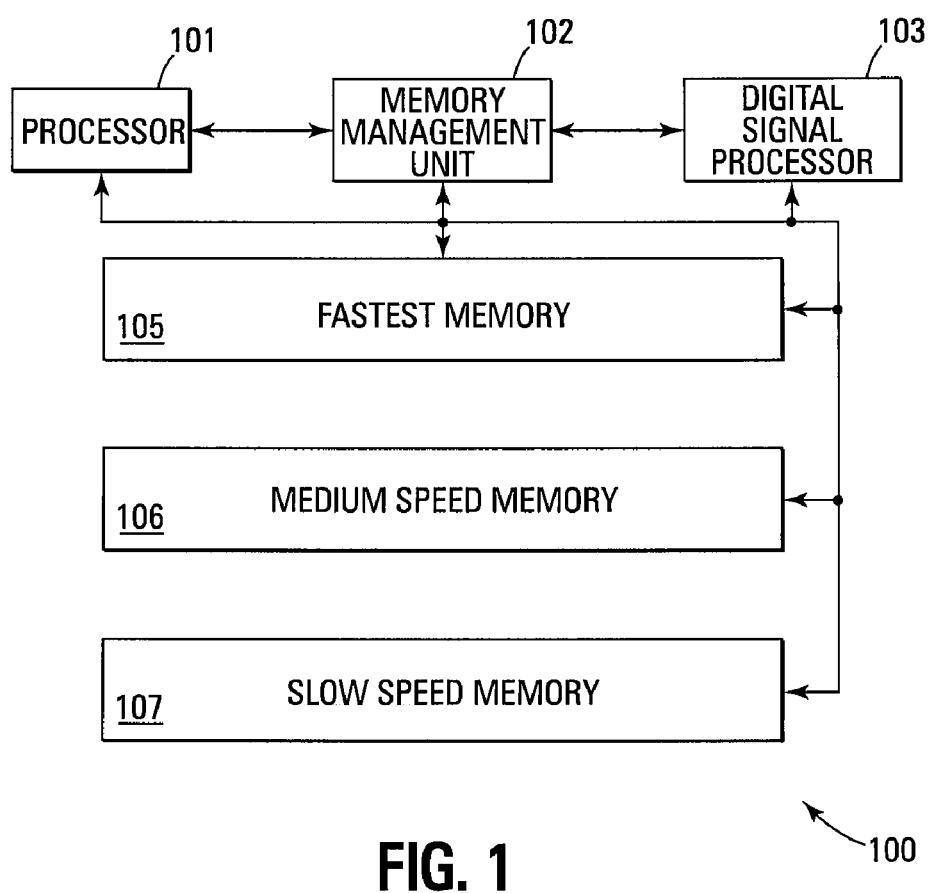
FIG. 1 shows a block diagram of one embodiment of a memory system of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions.

FIG. 1 illustrates a block diagram of one embodiment of an electronic system 100 of the present invention. The system 100 uses modified direct tunnel memory (DTM) cells, illustrated subsequently with reference to FIGS. 2 and 3, that have an embedded trap region for storing a charge. This significantly improves memory density as well as memory retention by several orders of magnitude over the prior art, providing a non-volatile memory while maintaining high program/erase speeds and the infinite endurance of DTM. The DRAM of a system can also be replaced by this memory. These benefits are accomplished by replacing the floating gate of a typical non-volatile memory with a relatively thin layer of embedded-trap oxynitride or metal nano-dot insulator to provide an efficient control gate to floating node coupling.

The memory devices of the present invention can be implemented in both planar and three-dimensional architectures as discussed with reference to the subsequent figures. The three-dimensional embodiment has the added benefits of providing a contact-less, virtual ground array for high bit density configurations.

The electronic system 100 comprises a processor 101 for controlling operation of the system 100. This circuit 101 may be a microprocessor, a microcontroller, or some other type of controlling circuit.

A memory management unit (MMU) 102 is coupled to the processor 101 and the memory blocks 105-107. The MMU 102 is the component that manages virtual memory systems. The MMU 102 may be part of the processor 101 or a separate block. The MMU 102 typically includes a small amount of memory that holds a table for matching virtual addresses to physical addresses.

In operation, all requests for memory access (i.e., read, write) are sent to the MMU 102. The MMU 102 then determines whether the data is in one of the memory blocks 105-107 or needs to be fetched from another memory location (i.e., mass storage). If the data is not in memory, the MMU 102 may issue an error message.

A digital signal processor (DSP) 103 may be included in the system for processing received signals. The DSP 103 is a specialized processor that is adapted specifically for processing signals. The DSP 103 typically has a special instruction set optimized for this task.

The memory system of FIG. 1 is for purposes of illustration only. Not all of the blocks are required for proper operation and the quantity of memory blocks 105-107 shown may be different for other embodiments. For example, one embodiment may only have a processor 101 and three memory blocks 105-107. Another alternate embodiment may have a processor with a different quantity of memory blocks 105-107.

The memory blocks 105-107 may be comprised of entire memory devices as illustrated subsequently in FIG. 5 or simply memory arrays that are controlled by one central memory controller and peripheral circuitry. In the embodiment of FIG. 1, the memory blocks 105-107 are broken down into three different speeds and retention characteristics.

One block 105 is the fastest memory block in terms of access speed (i.e., programming and erase operations). Such a block could be used to replace any required DRAM devices in the system since the read and write times could be less than or equal to DRAM read/write times (i.e., 30-50 ns).

In order to achieve these memory attributes, the first memory block 105 is comprised of an array of memory cells that have a tunnel thickness on the order of 1.5 nm. This would give the cells a retention time that could be measured in hours.

The second memory block 106 is comprised of medium speed memory cells. This block is comprised of an array of memory cells that have a tunnel thickness on the order of 2.5 nm. This would give the cells a retention time that could be measured in days or weeks. The thicker tunnel layer would also translate into slightly slower read/write times for the cells.

The third memory block 107 is comprised of the slowest speed memory cells. This block is comprised of an array of memory cells that have a tunnel thickness on the order of 3.5 nm. This would give the cells a retention time that could be on the order of 10 years or more. The thicker tunnel layer would also require the longest read/write times of the three memory blocks 105-107.

The above-illustrated tunnel layer thicknesses are for purposes of illustration only. Each block of memory may have different tunnel layer thicknesses than those illustrated in order to adjust the trade-off between read/write times and desired retention times.

In one embodiment, the system 100 illustrated in FIG. 1 is comprised of separate integrated circuits for each functional block 101-103, 105-107. An alternate embodiment integrates each of the functional blocks into a single chip. Similarly, the multiple memory blocks 105-107 may be implemented on a single chip separate from the processor 101, MMU 102, and DSP 103 blocks.

The embodiments of the present invention do not require that the memory blocks 105-107 have the same density or architecture (i.e., NAND, AND, NOR, VGA). For example, in one embodiment, the slowest memory array 107 may be a NAND array in a one gigabyte density, the medium speed memory array 106 may be a NOR array in a 512 megabyte density, and the fastest memory array 105 may be a NOR array in a 16 megabyte density.

Figure 2:
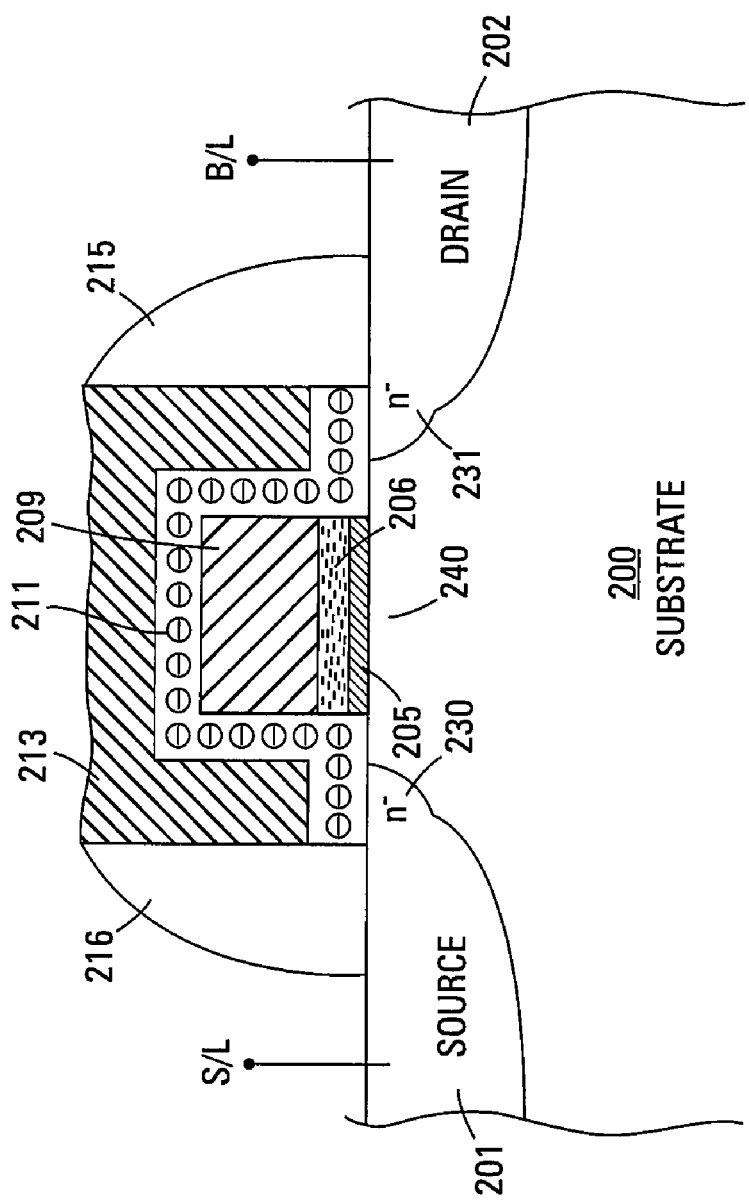
FIG. 2 shows a cross-sectional view of one embodiment of a planar non-volatile memory device of the present invention.
Figure 3:
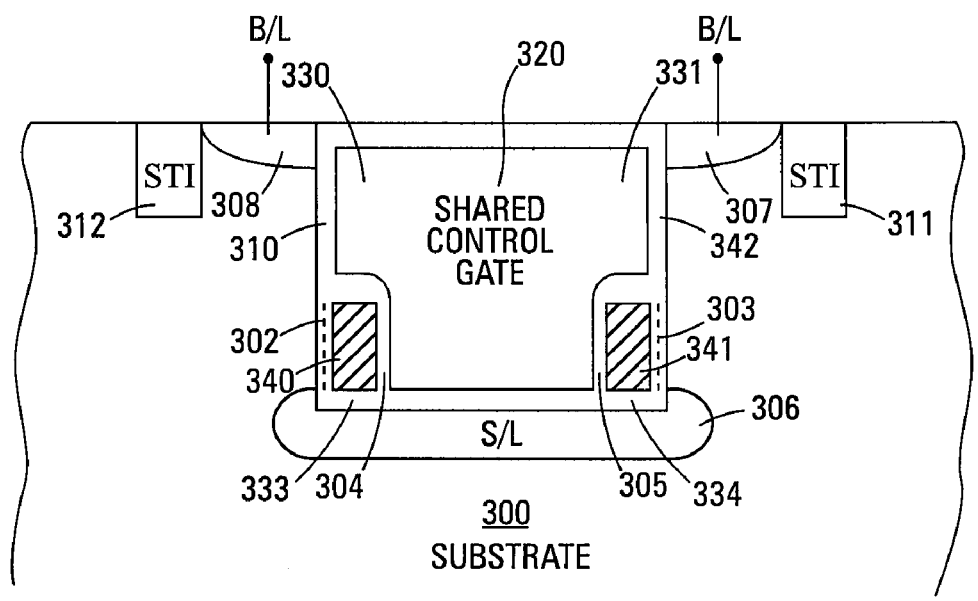
FIG. 3 shows a cross-sectional view of one embodiment of a three-dimensional, two-element, split channel non-volatile memory device of the present invention.

The embodiments of the present invention can also use different types of memory cells in each memory block 105-107. In one embodiment, all three memory blocks 105-107 are comprised of either planar memory cells, as illustrated in FIG. 2, or split channel, three dimensional memory cells, as illustrated in FIG. 3. In another embodiment, one of the memory blocks is comprised of split channel, three dimensional memory cells while the remaining memory blocks are planar. Still other embodiments use other variations on which memory blocks use planar and which use the higher density, vertical cells.

FIG. 2 illustrates a cross-sectional view of one embodiment of a planar, modified embedded DTM, non-volatile memory cell of the present invention. For purposes of clarity, this figure shows only one memory cell. It is well known in the art that a typical memory device may be comprised of millions or more of these cells.

The planar cells are fabricated on a substrate 200. In one embodiment, the substrate 200 is a p-type silicon. In an alternate embodiment, the substrate 200 is an n+ type silicon.

Doped diffusion regions 201, 202 are created in the substrate 200 for the source and drain regions. If the substrate is a p-type material, the diffusion areas 201, 202 are n+ conductivity. However, an alternate embodiment could use an n-type substrate thus requiring heavily doped p-type diffusion regions 201, 202. The diffusion regions 201, 202 act as source lines 201 and bit lines 202, depending on the direction of operation of the memory string. While the left diffusion region 201 is shown as being the source line, if the cell is operated in the opposite direction, the right diffusion region 202 can operate as the source line while the left diffusion region 201 would be the bit line.

A channel region 240 is located in the substrate 200 between each source line and bit line diffusion area 201, 202. As is well known in the art, these are the regions 240 in which the channels form during operation of the memory cells.

A floating stack is formed over the substrate 200. The floating stack is comprised of an oxynitride layer 205, a trapping layer 206, and an injector layer 209.

The oxynitride layer 205, in one embodiment, is comprised of a scalable SiON layer 205 that provides charge retention. This layer is approximately 1.5 nm thick with an atomic concentration of $Si:O:N \approx 1: \geq 1.3: \leq 0.5$, and a refractive index in the range of 1.5-1.6. This layer provides an improvement in charge leakage as compared to an equivalent thickness of $SiO_2$. In an alternate embodiment, this single layer may be replaced by multiple layers of direct tunnel dielectric of increasing band-offset and increasing higher dielectric constant (K). This would further improve the speed and charge retention of DTM.

The embedded trapping layer 206, in one embodiment, is a layer of embedded trap oxynitride or a metal nano-dot insulator layer. This provides longer charge retention in the deep quantum-well trap that is thus formed.

The oxynitride material might be SiON formed to a thickness in the range of 4.5-5.0 nm with a refractive index of approximately 1.8. The metal nano-dot elements can include Platinum (Pt), Iridium (Ir), Gold (Au), Cobalt (Co), Tungsten (W) or some other metal that provides deep energy electron and hole traps.

In one embodiment, the metal nano-dot layer 206 is deposited by sputtering or evaporation at relatively low temperatures. The density range of the metal nano-dots in the trapping layer 206 can be in the range of $2 \times 10^{12}$ to $10 \times 10^{12}$ with typical dot sizes in the range of 1-5 nm and spaced greater than 3 nm apart in the high-K dielectric material. Alternate embodiments can use different densities, dot sizes, and spacing.

The injector layer 209 that is formed over the embedded trap layer 206 can be comprised of a silicon rich nitride (SRN) that is highly conductive. This layer 209 acts as a top floating electrode while chemically passivating the lower embedded trap layer 206. The injector SRN 209 provides a large vertical interface between the floating node and the control gate, thus further enhancing the voltage coupling between the two.

The injector SRN 209, in one embodiment, is formed to a thickness in the range of 10-15 nm and has a refractive index of 2.5-2.7. This layer 209 can be deposited by low temperature chemical vapor deposition (CVD) or atomic layer deposition (ALD). Alternate embodiments may use other thicknesses and/or methods of deposition.

The floating stack is separated from the wrapped, polysilicon control gate 213 by a high-K coupling medium of thin layers 211 of oxide plus $Al_2O_3$ (K=10) oxide/$HfO_2$ (K=24), oxide/$ZrO_2$ (K=24), oxide/$Pr_2O_3$ (K=30), or oxide/$TiO_2$ (K=60). The material next to silicon causes a fixed negative charge in the layer 211 that helps to hold leakage that would normally leak out from the trap layer 206 and provides enhanced coupling between the control gate 213 and the embedded floating trap layer 206. This layer 211 also provides enhanced voltage scalability over a typical DTM device. Portions 230, 231 of the diffusion areas 201, 202 near this layer 211 are changed into n– areas by the fixed negative charge.

The polysilicon control gate 213 is bordered on each side by sidewall spacers 215, 216. In one embodiment, the spacers 215, 216 are comprised of $SiO_2$. Alternate embodiments may use other materials.

The embodiments of the memory cells of the present invention are not limited to any one predetermined architecture. The cells can be used in NAND arrays, NOR arrays, AND arrays, direct tunnel memory for DRAM devices, virtual gate arrays (VGA), and other types of memory architectures.

FIG. 3 illustrates a cross-sectional view of one embodiment of a three-dimensional, two-element, split channel DTM non-volatile memory device of the present invention. This embodiment uses substantially the same floating gate stack of the embodiment of FIG. 2 in a vertical, split channel, two-element configuration.

The vertical enhanced DTM cell is comprised of a trench formed in a silicon substrate 300. The trench contains two non-volatile cells, each comprised of a fixed threshold element 330, 331 in series with a bi-stable DTM element 333, 334, respectively. The fixed threshold elements 330, 331 provide over erasure protection and lower operating power requirements.

A shared control gate 320 is formed in the trench and separated from the trench sidewalls and the bi-stable elements by an oxide layer 310, 342. A shared source line 306 is formed in the substrate under the trench. Bit lines 307, 308 are formed in the substrate near the surface between the shallow trench isolation 311, 312 and the trench sidewalls.

Each bi-stable element 333, 334 is comprised of substantially the same DTM tunnel/trap layer 302, 303 as discussed with reference to FIG. 2. In this embodiment, the high-K layer 304, 305 and the control gate 320 may or may not wrap around the bottom edge of the injector SRN layers 340, 341. The shared control gate 320 design provides two NOR non-volatile memory bits per trench without requiring any direct metal contact for the control gate 320 and the shared source line 306 within the cell. Such contacts are made outside the cell, thus enhancing array density. This provides a density potential of less than $3F^2$ for a NOR DTM cell.

The fixed threshold elements are not required for proper operation of the embodiment of FIG. 3. In an alternate embodiment, the bi-stable elements could be located on each sidewall and share the common control gate 320.

Figure 4:
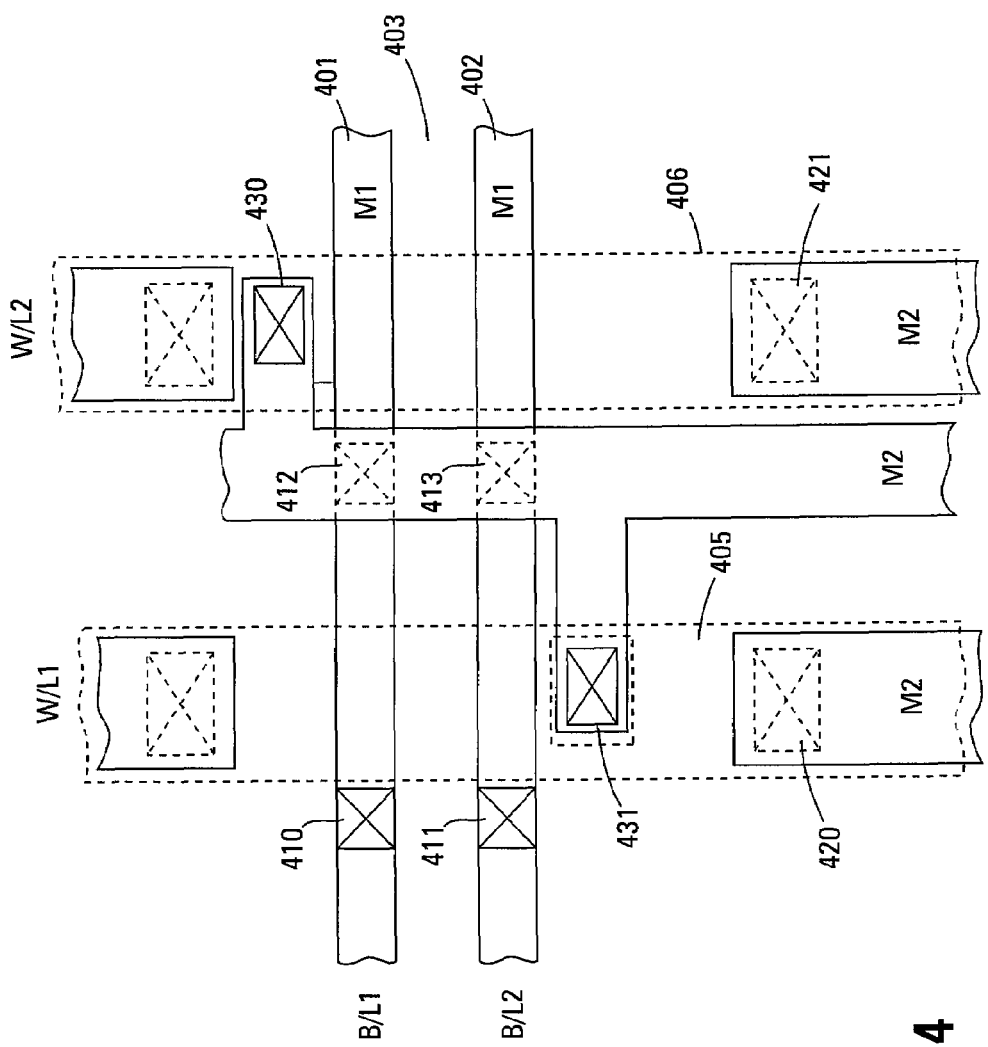
FIG. 4 shows a top layout view of a memory array in accordance with the embodiment of FIG. 3.

FIG. 4 illustrates a top layout view of the memory array in accordance with the embodiment of FIG. 3. This view shows two bit lines 401, 402 that are separated by an isolation region 403. The word lines W/L1 and W/L2 405, 406 run substantially perpendicular to the bit lines 401, 402.

Shared source line contacts 420, 321 are formed over the word lines 405, 406. Word line contacts 430, 431 are formed into the word lines 405, 406. Self-aligned bit line contacts 410-413 are formed into the bit lines 401, 402.

Figure 5:
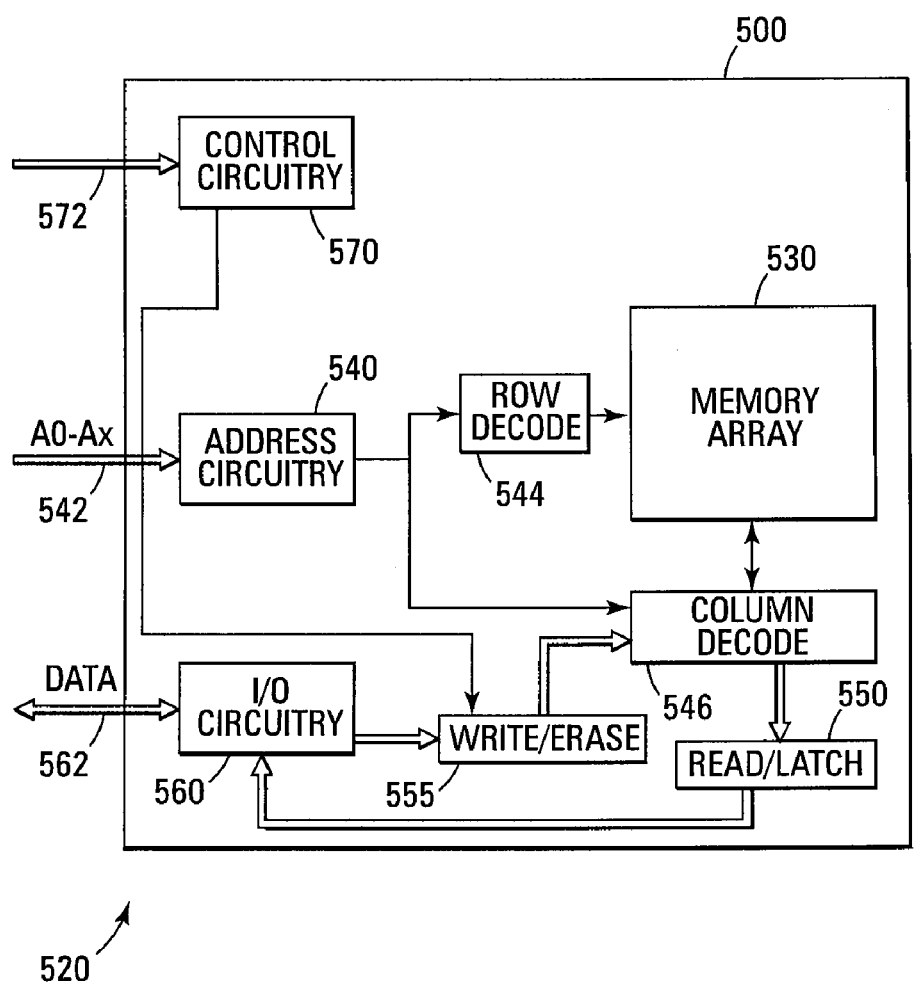
FIG. 5 shows a block diagram of one embodiment of a memory device of the present invention.

FIG. 5 illustrates a functional block diagram of a memory device 500 of the present invention. The memory device 500 has been simplified to focus on features of the memory that are helpful in understanding the present invention.

The memory device includes an array of memory cells 530 that can be comprised of the embodiments of the embedded trap DTM non-volatile memory cells that were previously illustrated. The memory array 530 is arranged in banks of rows and columns. The gates of each row of memory cells are coupled with a word line while the drain and source connections of the memory cells are coupled to bit lines.

An address buffer circuit 540 is provided to latch address signals provided on address input connections AO-Ax 542. Address signals are received and decoded by a row decoder 544 and a column decoder 546 to access the memory array 530. It will be appreciated by those skilled in the art, with the benefit of the present description, that the number of address input connections depends on the density and architecture of the memory array 530. That is, the number of addresses increases with both increased memory cell counts and increased bank and block counts.

The memory device 500 reads data in the memory array 530 by sensing voltage or current changes in the memory array columns using sense/buffer circuitry 550. The sense/buffer circuitry, in one embodiment, is coupled to read and latch a row of data from the memory array 530. Data input and output buffer circuitry 560 is included for bi-directional data communication over a plurality of data connections 562 with the controller 510. Write circuitry 555 is provided to write data to the memory array.

Control circuitry 570 decodes signals provided on control connections 572 from the processor 510. These signals are used to control the operations on the memory array 530, including data read, data write (program), and erase operations. The control circuitry 570 may be a state machine, a sequencer, or some other type of controller.

The memory device illustrated in FIG. 5 has been simplified to facilitate a basic understanding of the features of the memory. A more detailed understanding of internal circuitry and functions of memories are known to those skilled in the art.

CONCLUSION

The embodiments of the present invention provide a memory system that uses blocks of non-volatile memory with progressive levels of non-volatility. The memory blocks are comprised of scalable, modified "embedded trap DTM" non-volatile cells that can replace typical DRAM devices. Each different level of non-volatility uses a different thickness for the tunnel layer. The cells with the thicker tunnel layers have longer retention times but are slower during programming/erase operations. The cells with the thinner tunnel layers have shorter retention times but have substantially faster programming/erase operations and can thus replace typical DRAM devices.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory system comprising:
   a control circuit for generating memory system signals; and
   a plurality of memory arrays coupled to the control circuit, each memory array comprising a plurality of vertical memory cells, each memory cell of a first memory array comprising a control gate and a gate stack along a sidewall of a trench in a substrate, the gate stack having an oxynitride tunnel layer with a different thickness than the oxynitride tunnel layer in each of the plurality of vertical memory cells of the remaining memory arrays,
   wherein the gate stack further comprises an embedded trap layer and an injector layer; the embedded trap layer is ungraded and formed between and in contact with the tunnel layer and the injector layer; and a dielectric layer is formed between and in contact with the injector layer and the control gate.

2. The memory system of claim 1, wherein the first memory array has a NAND architecture.

3. The memory system of claim 1, wherein the control circuit is a microprocessor.

4. The memory system of claim 1, wherein the memory system further includes a memory management unit, coupled to the control circuit and the plurality of memory arrays, for managing access to the plurality of memory arrays in response to the memory system signals.

5. The memory system of claim 1, wherein at least one of the plurality of memory arrays is formed of flash memory cells.

6. The memory system of claim 1, wherein the embedded trap layer comprises an insulator layer.

7. The memory system of claim 6, wherein the oxynitride tunnel layer and the embedded trap layer are formed of SiON.

8. The memory system of claim 6, wherein the embedded trap layer is further comprises metal nano-dots in the insulator layer.

9. The memory system of claim 8, wherein the metal nano-dots comprise one of Platinum (Pt), Iridium (Ir), Gold (Au), Cobalt (Co), and Tungsten (W).

10. A memory device comprising:
a processor for generating memory signals;
a first memory array coupled to the processor, the first memory array comprising a first plurality of vertically formed memory cells each having an oxynitride tunnel layer with a first thickness;
a second memory array coupled to the processor, the second memory array comprising a second plurality of vertically formed memory cells each having an oxynitride tunnel layer with a second thickness; and
a third memory array coupled to the processor, the third memory array comprising a third plurality of vertically formed memory cells each having an oxynitride tunnel layer with a third thickness,
wherein the second thickness is greater than the first thickness and different from the third thickness; and,
wherein each vertically formed memory cell in the first, second and third pluralities of vertically formed memory cells comprises a control gate and a gate stack along a side wall of a trench in a substrate, the gate stack comprising the tunnel layer and further comprising an embedded trap layer and an injector layer; the embedded trap layer is ungraded and formed between and in contact with the tunnel layer and the injector layer; and a dielectric layer is formed between and in contact with the injector layer and the control gate.

11. The device of claim 10, wherein the injector layer comprises
a silicon rich nitride layer; and the dielectric layer has a high dielectric constant.

12. The memory system of claim 11, wherein the dielectric layer is formed of an oxide selected from a group consisted of: $Al_2O_3$, $HfO_2$, $ZrO_2$, $Pr_2O_3$, and $TiO_2$.

13. The memory device of claim 10, wherein the third thickness is greater than both the first and second thicknesses.

14. The memory device of claim 10, wherein the oxynitride tunnel layer has a refractive index of 1.55; and the embedded trap layer is formed of an oxynitride layer and has a refractive index of 1.8.

15. A split channel, non-volatile memory cell comprising:
a plurality of trenches formed in a substrate, each trench having sidewalls adjacent to diffusion regions formed in the substrate and a trench bottom adjacent to a source line diffusion area;
a gate stack formed along a sidewall of a trench from the plurality of trenches, the gate stack comprising:
an oxynitride tunnel layer formed over the substrate;
an embedded trap oxynitride layer formed over and in contact with the oxynitride tunnel layer, the embedded trap oxynitride layer is ungraded;
a silicon rich nitride injector layer formed over and in contact with the embedded trap oxynitride layer; and
a dielectric layer having a high dielectric constant and formed over and in contact with the silicon rich nitride injector layer; and
a control gate formed along said sidewall and coupled with the gate stack formed along said sidewall,
wherein the control gate is a shared control gate for both of said gate stack and another gate stack formed along another sidewall of said trench.

16. The memory cell of claim 15, wherein the control gate is shared amongst all gate stacks formed in the trench.

17. The memory cell of claim 15, wherein the control gate is a polysilicon control gate.

18. The memory cell of claim 15, wherein the control gate is separated from the trench sidewall by an oxide layer.

19. The memory cell of claim 15 wherein the embedded trap layer is formed of an insulator layer having metal nano-dots therein, the metal nano-dots comprising one of Platinum (Pt), Iridium (Ir), Gold (Au), Cobalt (Co), and Tungsten (W).

20. The memory cell of claim 15, wherein the dielectric layer is formed of an oxide selected from a group consisted of: $Al_2O_3$, $HfO_2$, $ZrO_2$, $Pr_2O_3$, and $TiO_2$.

* * * * *

UNITED STATES PATENT AND TRADEMARK OFFICE
CERTIFICATE OF CORRECTION

PATENT NO. : 7,385,245 B2 Page 1 of 1
APPLICATION NO. : 11/370125
DATED : June 10, 2008
INVENTOR(S) : Bhattacharyya It is certified that error appears in the above-identified patent and that said Letters Patent is hereby corrected as shown below:

In column 9, line 5, in Claim 8, after "layer" delete "is".

Signed and Sealed this

Nineteenth Day of August, 2008

JON W. DUDAS
*Director of the United States Patent and Trademark Office*